United States Patent
Chen

(10) Patent No.: US 9,443,921 B2
(45) Date of Patent: Sep. 13, 2016

(54) SEMICONDUCTOR PACKAGE STRUCTURE AND SEMICONDUCTOR MANUFACTURING PROCESS

(71) Applicant: Advanced Semiconductor Engineering, Inc., Kaohsiung (TW)

(72) Inventor: Chi-Han Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/618,822

(22) Filed: Feb. 10, 2015

(65) Prior Publication Data

US 2016/0233292 A1  Aug. 11, 2016

(51) Int. Cl.
*H01L 23/48* (2006.01)
*H01L 49/02* (2006.01)
*H01L 23/00* (2006.01)

(52) U.S. Cl.
CPC .............. *H01L 28/10* (2013.01); *H01L 24/26* (2013.01); *H01L 24/83* (2013.01)

(58) Field of Classification Search
CPC ....... H01L 28/10; H01L 24/26; H01L 24/83; H01L 23/481; H01L 21/76805
USPC ........ 257/690, 698, 734, 774, 787; 438/112, 438/123
See application file for complete search history.

(56) References Cited

U.S. PATENT DOCUMENTS

| | | | |
|---|---|---|---|
| 5,256,900 A * | 10/1993 | Hashizume | ....... H01L 23/49811 257/678 |
| 6,423,570 B1 | 7/2002 | Ma et al. | |
| 6,639,324 B1 | 10/2003 | Chien | |
| 6,709,897 B2 | 3/2004 | Cheng et al. | |
| 6,709,898 B1 | 3/2004 | Ma et al. | |
| 6,919,508 B2 | 7/2005 | Forcier | |
| 6,946,325 B2 | 9/2005 | Yean et al. | |
| 7,145,228 B2 | 12/2006 | Yean et al. | |
| 7,872,347 B2 | 1/2011 | Kaufmann | |
| 7,982,292 B2 | 7/2011 | Mengel et al. | |
| 8,294,249 B2 * | 10/2012 | Pilling | .............. H01L 23/49503 257/676 |
| 2007/0004065 A1 * | 1/2007 | Schardt | ................. H01L 33/507 438/26 |
| 2007/0178622 A1 * | 8/2007 | Liu | ...................... H01L 23/3128 438/106 |
| 2009/0280617 A1 | 11/2009 | Cheng | |
| 2010/0307803 A1 * | 12/2010 | Paul | ......................... B32B 7/12 174/257 |
| 2013/0037929 A1 * | 2/2013 | Essig | ................ H01L 23/49816 257/693 |
| 2013/0207745 A1 | 8/2013 | Yun et al. | |
| 2013/0271241 A1 * | 10/2013 | Liu | ........................ H03H 7/422 333/175 |
| 2014/0061929 A1 * | 3/2014 | Inaba | ...................... H01L 23/52 257/762 |

* cited by examiner

*Primary Examiner* — Jarrett Stark
*Assistant Examiner* — Shahed Ahmed
(74) *Attorney, Agent, or Firm* — Foley & Lardner LLP; Cliff Z. Liu; Angela D. Murch

(57) ABSTRACT

The present disclosure relates to a semiconductor package structure and a manufacturing method thereof. The semiconductor package structure comprises a first dielectric layer, a die pad, an active component, at least one first metal bar, at least one second metal bar and a through via. The first dielectric layer has a first surface and a second surface opposite to the first surface. The die pad is located within the first dielectric layer. The active component is located within the first dielectric layer and disposed on the die pad. The first metal bar is disposed on the first surface of the first dielectric layer, and electrically connected to the active component. The second metal bar is disposed on the second surface of the first dielectric layer. The through via penetrates the first dielectric layer and connects the at least one first metal bar to the at least one second metal bar.

16 Claims, 9 Drawing Sheets

SEMICONDUCTOR PACKAGE STRUCTURE AND SEMICONDUCTOR MANUFACTURING PROCESS

BACKGROUND

1. Technical Field

The present disclosure relates to a semiconductor package structure and a semiconductor manufacturing process, and more particularly to a semiconductor package structure and a semiconductor process thereof.

2. Description of the Related Art

Semiconductor devices have become progressively more complex, driven at least in part by the demand for smaller sizes and enhanced processing speeds. At the same time, there is a demand to further miniaturize many electronic products containing these semiconductor devices. Semiconductor devices are typically packaged, and then may be installed on a substrate that includes electrical circuitry, such as a circuit board. This results in space being occupied by both the semiconductor device package and the substrate, with a surface area on the substrate being occupied by the semiconductor device package. In addition, costs may be incurred by performing packaging, board manufacturing, and assembly as separate processes. It would be desirable to reduce the space occupied by the semiconductor device on the substrate, and to simplify and combine the packaging, board manufacturing, and assembly processes applicable to the semiconductor device and the substrate.

SUMMARY

In accordance with an embodiment of the present disclosure, a semiconductor package structure comprises a first dielectric layer, a die pad, an active component, at least one first metal bar, at least one second metal bar and a through via. The first dielectric layer has a first surface and a second surface opposite to the first surface. The die pad is located within the first dielectric layer. The active component is located within the first dielectric layer and disposed on the die pad. The first metal bar is disposed on the first surface of the first dielectric layer, and electrically connected to the active component. The second metal bar is disposed on the second surface of the first dielectric layer. The through via penetrates the first dielectric layer and connects the at least one first metal bar to the at least one second metal bar.

In accordance with an embodiment of the present disclosure, a semiconductor package structure comprises a first dielectric layer, a die and a first spiral inductor. The first dielectric layer has a top surface. The die is located within the first dielectric layer. The first spiral inductor is located within the first dielectric layer. At least one terminal of the first spiral inductor is electrically connected to the die. The central axis of the first spiral inductor is substantially parallel to the top surface of the first dielectric layer.

In accordance with an embodiment of the present disclosure, a method of manufacturing a semiconductor package structure comprises (a) providing a die pad; (b) placing an active component on the die pad; (c) forming a first dielectric layer to encapsulate the die pad and the active component, the first dielectric layer having a first surface and a second surface opposite the first surface; (d) forming a plurality of through vias in the first dielectric material, the plurality of through vias exposed from the first surface and the second surface of the first dielectric layer; (e) forming a first set of metal bars on the first surface of the first dielectric layer to connect to the plurality of through vias; and (f) forming a second set of metal bars on the second surface of the first dielectric layer to connect to the plurality of through vias.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
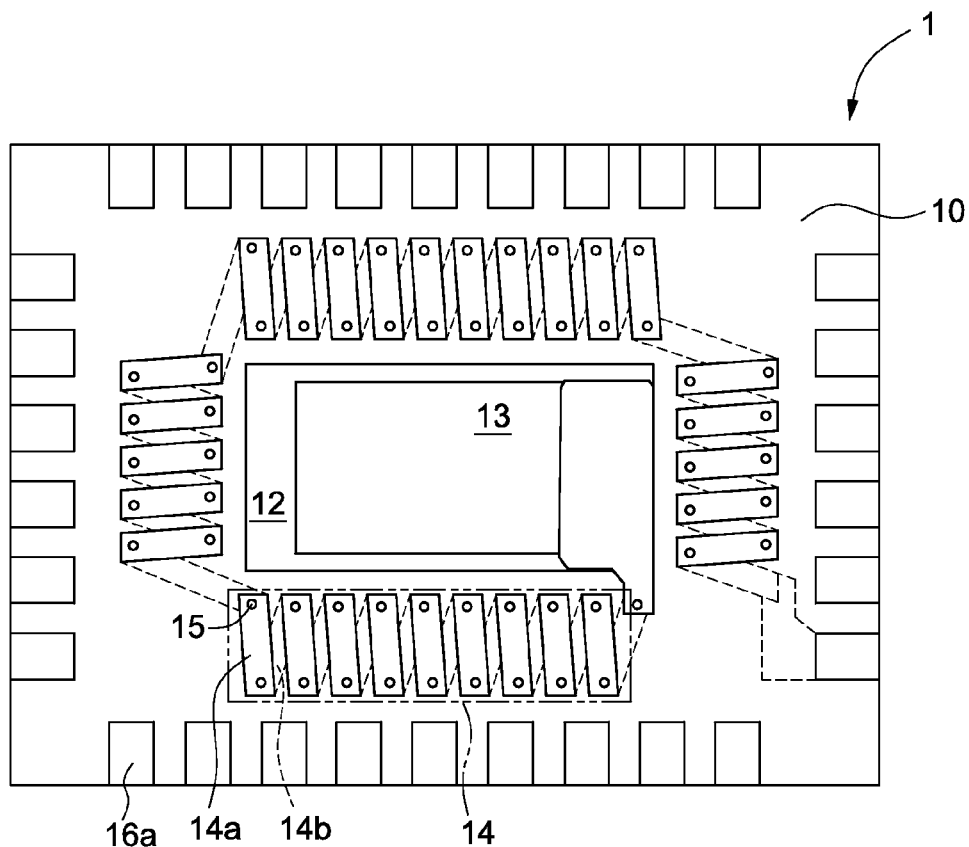
FIG. 1 illustrates a semiconductor package structure in accordance with an embodiment of the present disclosure.

FIG. 1 illustrates a semiconductor package structure 1 in accordance with an embodiment of the present disclosure. The semiconductor package structure 1 includes an insulating layer (e.g., a first dielectric layer 10), a die pad 12, an active component 13 (e.g., a die or an integrated circuit (IC)), a plurality of first metal bars 14a, a plurality of second metal bars 14b, a plurality of through vias 15 and a plurality of first metal contacts 16a (e.g., conductive pads).

The first dielectric layer 10 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The die pad 12 is within the first dielectric layer 10. The active component 13 is within the first dielectric layer 10 and placed on the die pad 12. The active component 13 may be, for example, a power IC or a radio frequency IC (RFIC).

The first metal bars 14a are placed on the top surface of the first dielectric layer 10. In one embodiment, the first metal bars 14a are arranged in a first direction so that they are substantially parallel to each other along a side of the die pad 12. However, this orientation is not limiting. The material of the first metal bars 14a may include, but is not limited to, copper (Cu) or another metal or alloy.

The second metal bars 14b are placed on the bottom surface of the first dielectric layer 10. In one embodiment, the second metal bars 14b are arranged in a second direction so that they are substantially parallel to each other along a side of the die pad 12. However, this orientation is not limiting. The material of the second metal bars 14b may include, but is not limited to, copper (Cu) or another metal or alloy.

In embodiments in which the first metal bars 14a along a side of the die pad 12 are oriented substantially parallel to each other in a first direction, and the second metal bars 14b along the same side of the die pad 12 are oriented substantially parallel to each other in a second direction, as illustrated for the embodiment of FIG. 1, the second direction is different from the first direction. In any case, each second metal bar 14b is arranged at an angle (or at angles) relative to a corresponding one or ones of the first metal bars 14a along a side of the die pad 12.

The through vias 15 penetrate the first dielectric layer 10. Each through via 15 electrically connects one of the first metal bars 14a to a corresponding second metal bar 14b. In an embodiment in which the first metal bars 14a are oriented in one direction (i.e., in parallel with respect to each other along a side of the die pad 12), and the second metal bars 14b are oriented in another direction (i.e., in parallel with respect to each other along the same side of the die pad 12), the through vias 15 may connect the first metal bars 14a and the second metal bars 14b to form a three dimensional (3D) solenoid structure along the side of die pad 12. Such a 3D solenoid structure is illustrated by way of example in FIG. 1 as a 3D spiral inductor 14. At least one terminal of the spiral inductor 14 is electrically connected to the active component 13. A central axis of the spiral inductor 14 is substantially parallel to the top surface or the bottom surface of the first dielectric layer 10. In one embodiment, the spiral inductor 14 is arranged along one edge of the active component 13 so that the central axis of the spiral inductor 14 is substantially parallel to the edge of the active component 13. However, this orientation is not limiting.

The first metal contacts 16a electrically connect the active component 13 to one or more of the first metal bars 14a, the second metal bars 14b, other components within or on the semiconductor package structure, external circuits, or external interfaces including power supply or ground interfaces.

Figure 2:
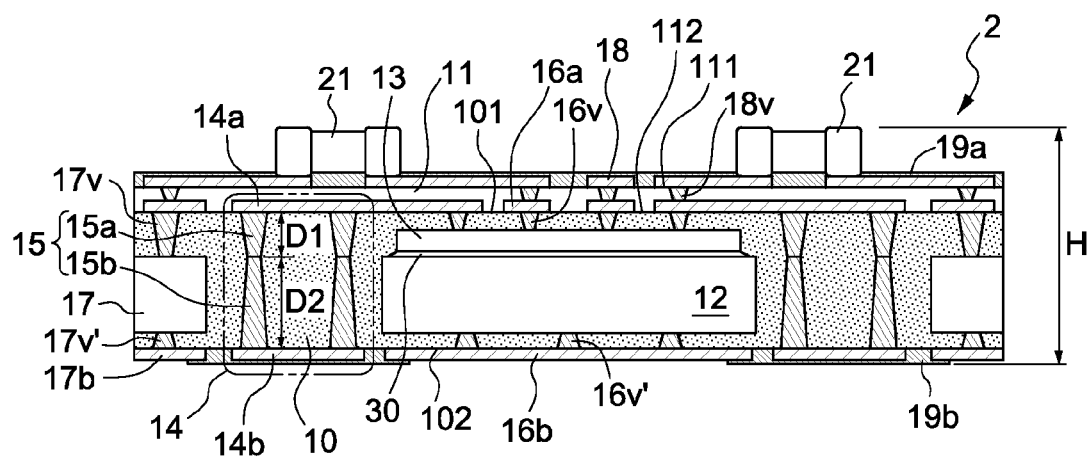
FIG. 2 illustrates a cross-sectional view of a semiconductor package structure in accordance with an embodiment of the present disclosure.

FIG. 2 illustrates a cross section view of a semiconductor package structure 2 in accordance with an embodiment of the present disclosure. The semiconductor package structure 2 of FIG. 2 is similar to the semiconductor package structure 1 of FIG. 1, except that the semiconductor package structure 2 of FIG. 2 further comprises a second dielectric layer 11, a plurality of second metal contacts 18, a first protective layer 19a, a second protective layer 19b and passive elements 21.

The first dielectric layer 10 has a first surface (or top surface) 101 and a second surface (or bottom surface) 102 opposite to the first surface 101. The die pad 12 is embedded or buried within the first dielectric layer 10. The active component 13 is placed on the die pad 12 and embedded or buried within the first dielectric layer 10. The first metal contacts 16a are disposed on the first surface 101 of the first dielectric layer 10 and are electrically connected to the active component 13 through vias 16v.

A plurality of leads 17 are embedded or buried within the first dielectric layer 10. The leads 17 are connected to the first metal contacts 16a through vias 17v. The leads 17 are connected to metal contacts 17b disposed on the second surface 102 of the first dielectric layer 10 through vias 17v'. In one embodiment, the leads 17 and the die pad 12 are combined to form a leadframe structure.

The die pad 12 is connected with a metal layer 16b by vias 16v', so as to prevent the die pad 12 from being bent (such as warpage).

Through vias 15 extend between first metal bars 14a and second metal bars 14b. In one embodiment, each through via 15 comprises a downward-tapering upper portion 15a and an upward-tapering bottom portion 15b. In other words, the upper portion 15a and the bottom portion 15b both include funnel-shaped portions facing in opposing directions, as illustrated in FIG. 2. The depth D1 of the downward-tapering upper portion 15a is different from the depth D2 of the upward-tapering bottom portion 15b. In one embodiment, D1 is greater than D2. In the embodiment illustrated in FIG. 2, D2 is greater than D1. In other embodiments, D1 may be substantially equal to D2. The upper portion 15a of each through via 15 is buried in the first dielectric layer 10 and is electrically connected to a first metal bar 14a. The bottom portion 15b of each through via 15 is buried in the first dielectric layer 10 and is electrically connected to a second metal bar 14b.

The second dielectric layer 11 has a first surface (or top surface) 111 and a second surface (or bottom surface) 112 opposite to the first surface 111. The second dielectric layer 11 is disposed on the first dielectric layer 10, and the second surface 112 of the second dielectric layer 11 is attached to the first surface 101 of the first dielectric layer 10. The second dielectric layer 11 covers the first metal contacts 16a and the plurality of first metal bars 14a.

The second dielectric layer 11 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The plurality of second metal contacts 18 are disposed on the first surface 111 of the second dielectric layer 11, and may be electrically connected to the first metal contacts 16a through a plurality of second vias 18v.

The first protective layer (e.g., solder mask) 19a is disposed on the first surface 111 of the second dielectric layer 11. The first protective layer 19a covers the second metal contacts 18 and the first surface 111 of the second dielectric layer 11.

The second protective layer (e.g., solder mask) 19b is disposed on the second surface 102 of the first dielectric layer 10. The second protective layer 19b covers the second metal bars 14b, a portion of the metal layer 16b, and one or more, or portions of one or more, of the metal contacts 17b.

In one embodiment, the passive elements 21 are placed on the first surface 111 of the second dielectric layer 11, and electrically connected to one or more, of the second metal contacts 18. The passive elements 21 may be, for example, capacitors or resistors.

As shown in FIG. 2, embedding the inductor 14 in the first dielectric layer 10 can reduce the thickness H of the semiconductor package structure 2. In comparison with other embodiments, in which the inductor is placed on the top surface of the dielectric layer, the thickness H of the semiconductor structure 2 can be reduced by approximately 0.4 mm-0.6 mm. Such a reduction in thickness H may represent approximately a 25% to 40% reduction. Thus, embedding the inductor in the dielectric layer may allow for reduction of the size of the semiconductor package structure 2, which may reduce the manufacturing cost.

Further, embedding the inductor 14 in the first dielectric layer 10 may reduce, or substantially eliminate, eddy current loss. Therefore, the inductor 14 embedded in the dielectric layer may have a higher Q factor in comparison with the inductor placed on the top surface of the dielectric layer. The Q factor of an embedded inductor implemented in accordance with the present disclosure is approximately in the range of 50 to 60.

In addition, if, as shown in FIG. 1, the central axis of the spiral inductor 14 is substantially parallel to an edge of the active component 13, the direction of the magnetic field within a core surrounded by the spiral inductor 14 would also be substantially parallel to the edge of the active component 13. In other words, most of the magnetic field would be directed away from the active component 13; thus, the influence of the active component 13 on the inductor 14 would be reduced, and the inductor 14 would have a higher Q factor. Additionally, circuits (e.g., RF circuits) within the active component 13 could have improved performance due to the higher Q factor of the inductor 14, as well as improved performance due to the magnetic field being directed away from the active component 13 (i.e., reduction of electromagnetic interference within active component 13.

Figure 3:
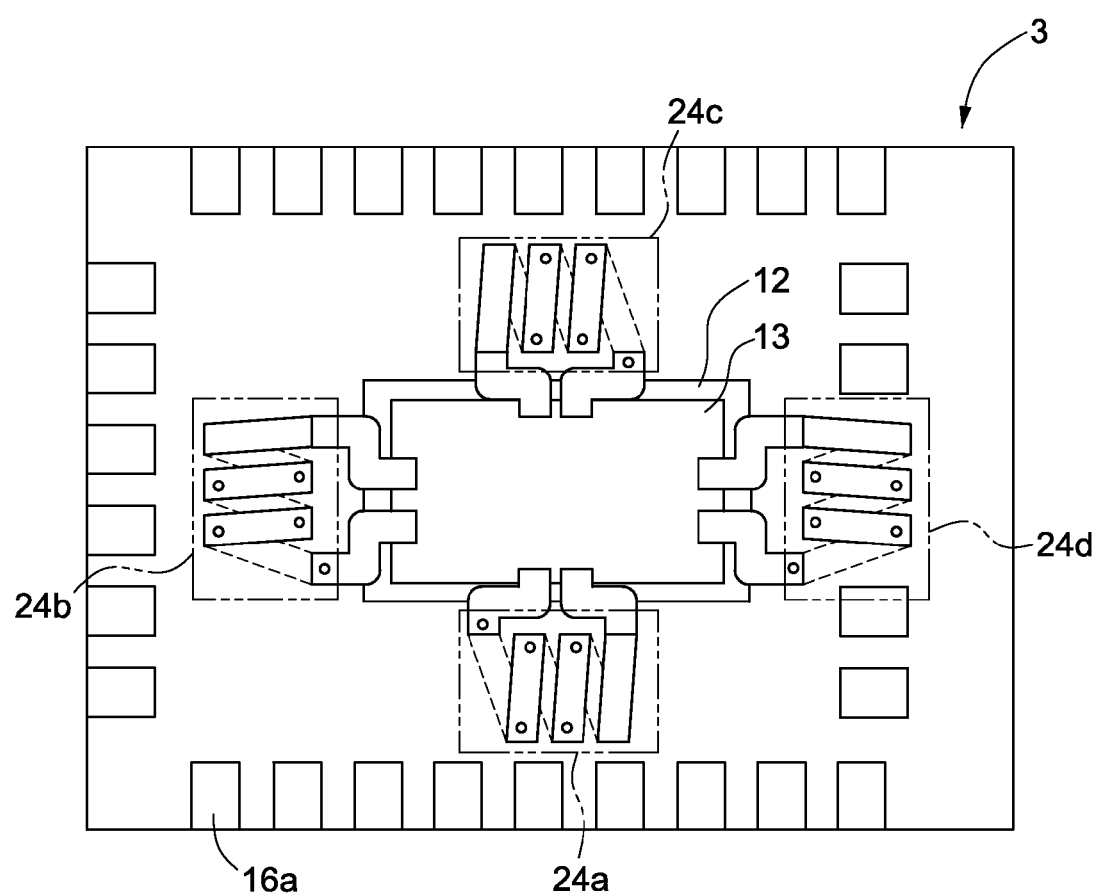
FIG. 3 illustrates a semiconductor package structure in accordance with an embodiment of the present disclosure.

FIG. 3 illustrates a semiconductor package structure 3 in accordance with an embodiment of the present disclosure. The semiconductor package structure 3 of FIG. 3 is similar to the semiconductor package structure 1 of FIG. 1, except that in the semiconductor package structure 1 of FIG. 1, the four spiral inductors 14 around the periphery of active component 13 are illustrated as being interconnected, but in the semiconductor package structure 3 of FIG. 3, a plurality of spiral inductors 24a, 24b, 24c and 24d are not interconnected, and are illustrated as each being electrically connected to the active component 13.

The spiral inductors 24a, 24b, 24c and 24d are electrically isolated from each other. Each spiral inductor can magnetically couple with adjacent inductors to form a transformer. For example, the spiral inductor 24a may be magnetically coupled with the spiral inductors 24b and 24d to form a transformer. In one embodiment, the active component 13 of FIG. 3 is an RFIC.

Figure 4:
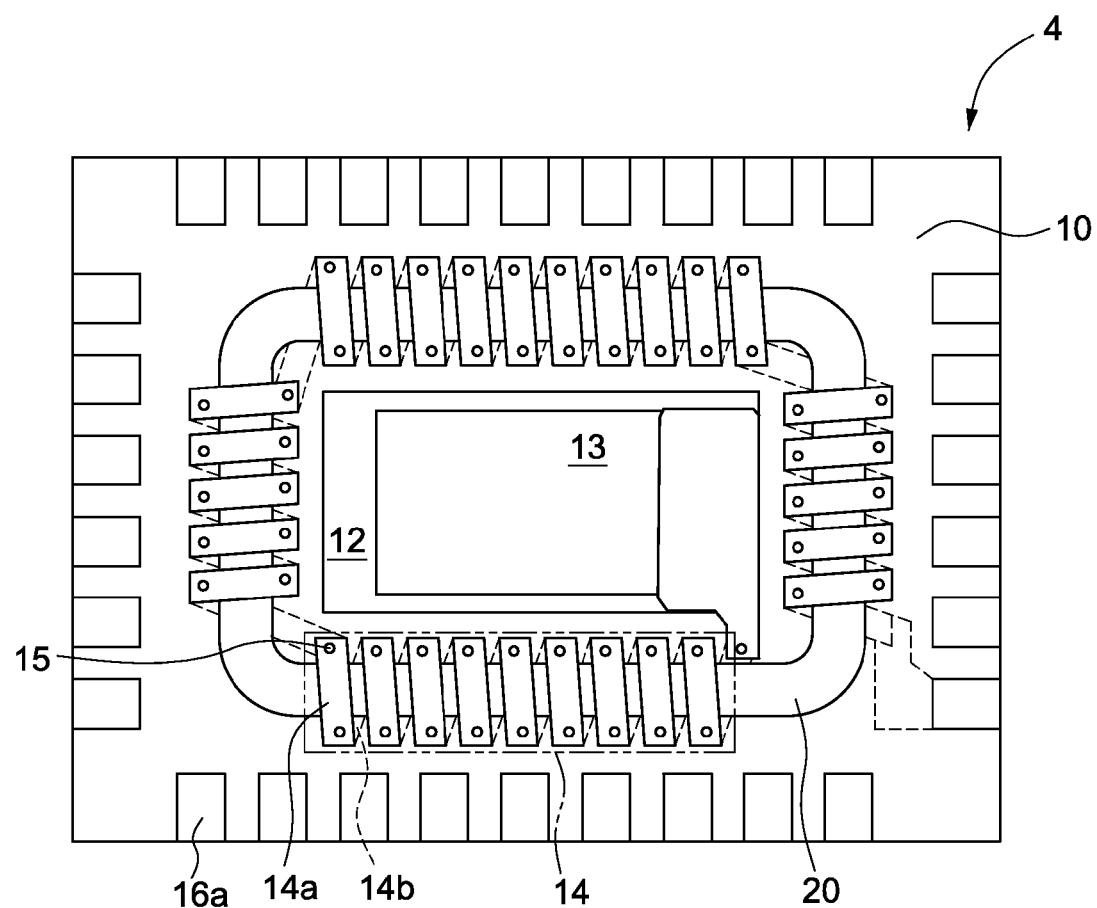
FIG. 4 illustrates a semiconductor package structure in accordance with an embodiment of the present disclosure.

FIG. 4 illustrates a semiconductor package structure 4 in accordance with an embodiment of the present disclosure. The semiconductor package structure 4 of FIG. 4 is similar to the semiconductor package structure 1 of FIG. 1, except that the semiconductor package structure of FIG. 4 further comprises a magnetic material 20.

The magnetic material 20 is buried in the first dielectric layer 10 within the central space (the core) formed or surrounded by the spiral inductor 14. The magnetic material 20 is separated from the spiral inductor 14 by the first dielectric layer 10. The use of the magnetic material may increase the intensity of magnetization, permeability and magnetic flux density of the inductor 14. Therefore, in comparison with the inductor without the magnetic material, the active component 13 has less influence from the inductor 14 and the inductor 14 would have a higher Q factor.

FIGS. 5A, 5B, 5C, 5D, 5E and 5F illustrate a manufacturing method in accordance with an embodiment of the disclosure.

Figure 5A:
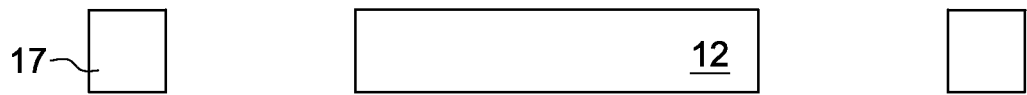
FIG. 5A, FIG. 5B, FIG. 5C, FIG. 5D, FIG. 5E and FIG. 5F illustrate a manufacturing method in accordance with an embodiment of the present disclosure.

Referring to FIG. 5A, a leadframe comprising a die pad 12 and a plurality of leads 17 is provided. The leadframe is preferably made of copper or its alloy. In some embodiments, the leadframe may be made of one of, or a combination of, iron or an iron alloy, nickel or a nickel alloy, or other metal or metal alloy. In some embodiments, the leadframe is coated with a copper layer.

Figure 5B:
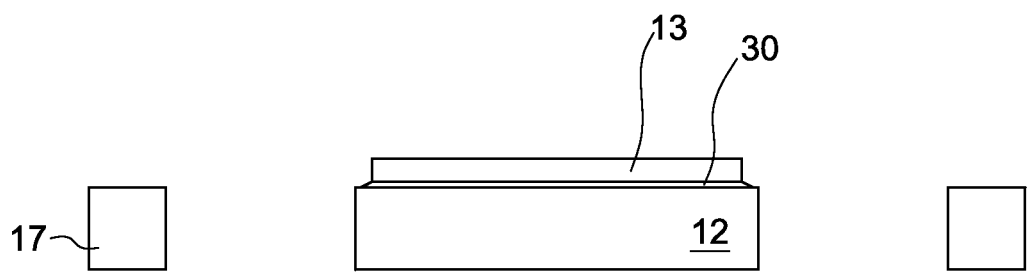

Referring to FIG. 5B, an active component 13 is placed on the die pad 12. The active component 13 is attached to the top surface of the die pad 12. At least one bonding wire (not shown) is bonded from the active component 13 to a lead 17.

Figure 5C:
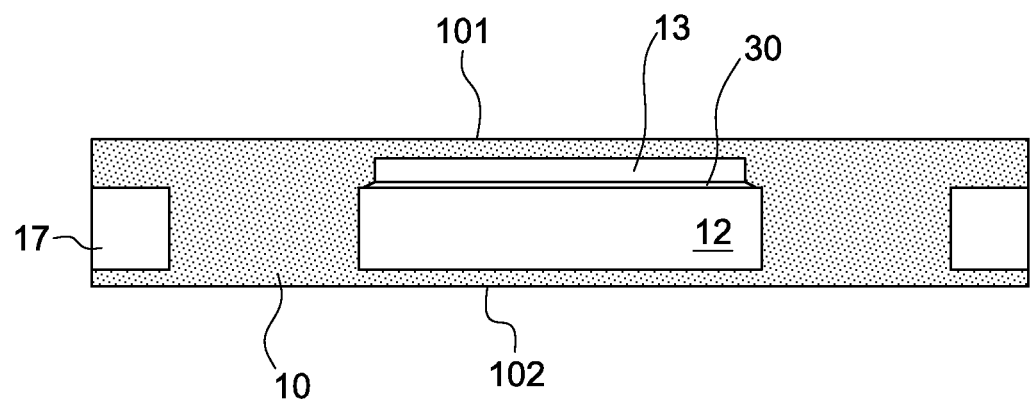

Referring to FIG. 5C, a first dielectric layer 10 is formed to bury or encapsulate the die pad 12, the leads 17 and the active component 13. The first dielectric layer 10 has a first surface 101 and a second surface 102 opposite the first surface 101. The first dielectric layer 10 may be formed by, for example, laminating a dielectric adhesive material to the leadframe.

Figure 5D:
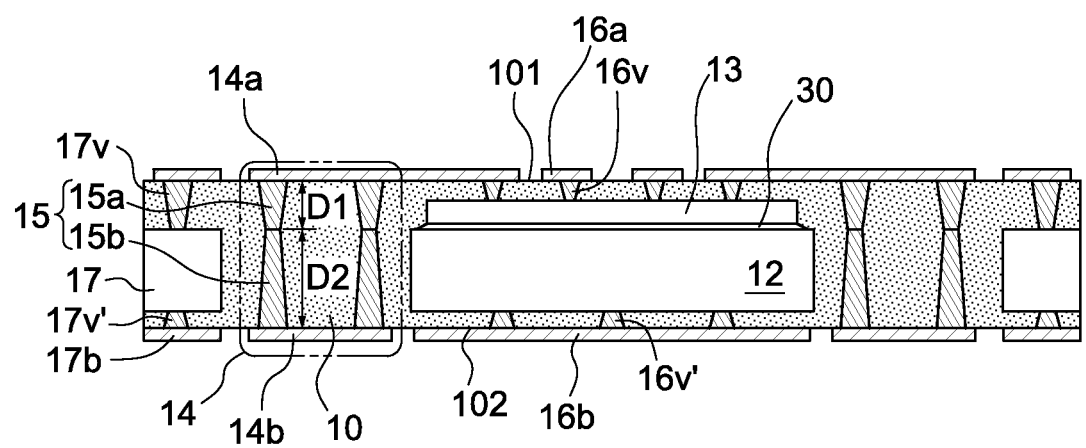

Referring to FIG. 5D, a plurality of vias 16v, 17v is formed to electrically connect to the active component 13 and the leads 17. In one embodiment, the vias 16v, 17v are formed by the following steps: (i) drilling a plurality of via holes on the first surface 101 of the first dielectric layer 10; and (ii) filling the via holes with conductive materials and epoxy.

In addition, a plurality of vias 16v', 17v' are formed to connect to the die pad 12 and the leads 17. The steps of forming the vias 16v', 17v' are similar to those of forming the vias 16v, 17v, except that the via holes of the vias 16v', 17v' are formed on the second surface 102 of the first dielectric layer 10.

Referring to FIG. 5D, a plurality of through vias 15 are formed to penetrate the first dielectric layer 10. In one embodiment, the through vias 15 are formed by the following steps: (i) drilling a plurality of downward-tapering first openings from the first surface 101 of the first dielectric layer 10 without penetrating through the first dielectric layer 10 to the bottom surface 102 of the first dielectric layer 10; (ii) plating a conductive material in the first openings to form an upper portion 15a of the through vias 15; (iii) forming a plurality of upward-tapering second openings from the second surface 102 of the first dielectric layer 10 to expose the upper portion 15a of the through vias 15; (iv) plating a conductive material in the second openings to form a bottom portion 15b of the through vias 15, the bottom portion 15b electrically connecting to the upper portion 15a in the first dielectric layer 10 to form the through vias 15. In other embodiments, the downward tapering first openings and the upward tapering second openings are both formed before the conductive material is plated, such that the upper portions 15a and the bottom portions 15b of the through vias 15 are formed at the same time.

Referring to FIG. 5D, a plurality of first metal bars 14a are formed on the first surface 101 of the first dielectric layer 10 to electrically connect to the upper portion 15a of the through vias 15 exposed from the first surface 101 of the first dielectric layer 10. A plurality of second metal bars 14b are formed on the second surface 102 of the first dielectric layer 10 to electrically connect to the bottom portion 15b of the through vias 15 exposed from the second surface 102 of the first dielectric layer 10. The through vias 15 electrically connect each of the first metal bars 14a to a corresponding second metal bar 14b, to form a 3D solenoid structure, for example, a 3D spiral inductor 14.

In one embodiment, a 3D solenoid structure is formed along a side of the die pad 12, and in the 3D solenoid structure, each of the first metal bars 14a is arranged in a first direction so that the first metal bars 14a are substantially parallel to each other, each of the second metal bars 14b is arranged in a second direction so that the second metal bars 14b are substantially parallel to each other, and the second direction is different from the first direction.

A plurality of first metal contacts 16a are formed on the first surface 101 of the first dielectric layer 10 to electrically connect to the vias 16v, 17v. A second metal layer 16b and a plurality of metal contacts 17b are formed on the second surface 102 of the first dielectric layer 10 to electrically connect to the vias 16v', 17v'.

Figure 5E:
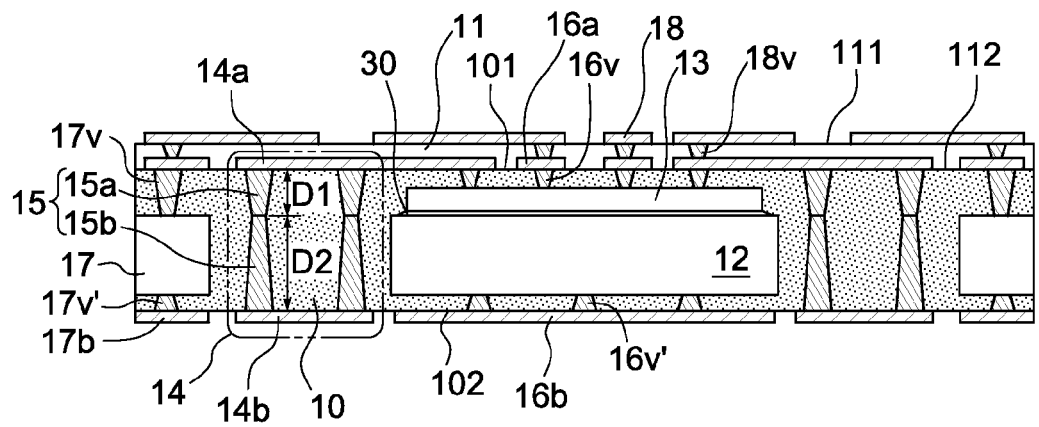

Referring to FIG. 5E, a second dielectric layer 11 is formed on the first surface 101 of the first dielectric layer 10 to encapsulate the first metal contacts 16a and the plurality of first metal bars 14a. For example, the second dielectric layer 11 may be formed using a molding technology, which uses a molding compound with the help of a mold chase (not shown), to encapsulate the first metal contacts 16a and the plurality of first metal bars 14a. For another example, the second dielectric layer 11 may be formed by stacking or laminating a number of sheets (e.g., sheets made from pre-impregnated composite fibers) on the first dielectric layer 10, the first metal contacts 16a and the plurality of first metal bars 14a, forming the second dielectric layer 11.

A plurality of second vias 18v are formed within the second dielectric layer 11 to electrically connect to one or more of the first metal contacts 16a. The steps of forming the second vias 18v are similar to those of forming the vias 16v. A plurality of second metal contacts 18 are formed on a first surface 111 of the second dielectric layer 11 to electrically connect to the second vias 18v.

Figure 5F:
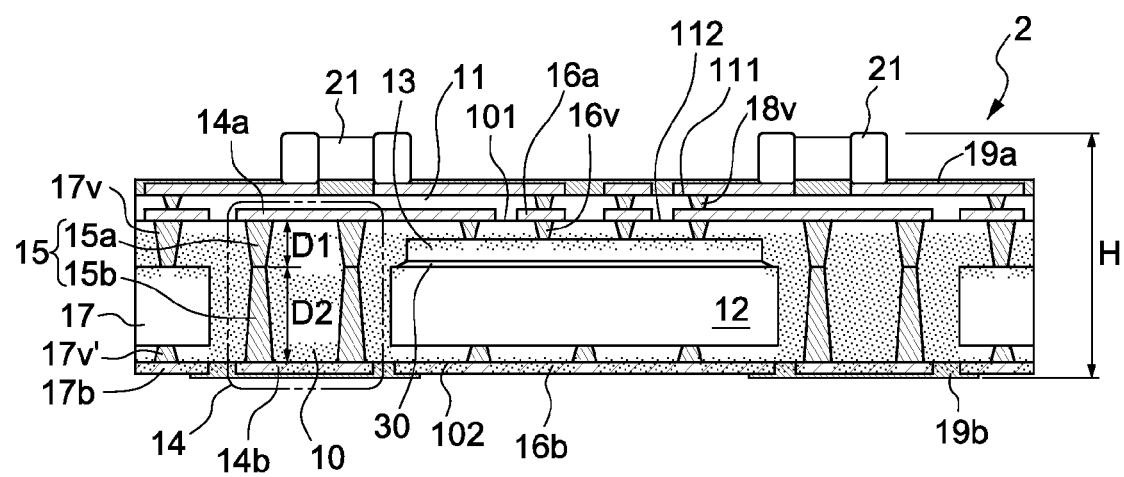

Referring to FIG. 5F, a first protective layer (solder mask) 19a may be formed on the first surface 111 of the second dielectric layer 11. The first protective layer 19a covers one or more of the second metal contacts 18 and the first surface 111 of the second dielectric layer 11, and exposes one or more of the second metal contacts 18. The passive elements 21 are placed on the first surface 111 of the second dielectric layer 11, and are electrically connected to the one or more exposed second metal contacts 18.

The second protective layer 19b is formed on the second surface 102 of the first dielectric layer 10. The second protective layer 19b covers the second metal bars 14b, a portion of the metal layer 16b, and one or more of the metal contacts 17b.

Then, a singulation process is performed to divide a semiconductor package structure strip into a plurality of semiconductor package structures. The singulation process is performed using an appropriate laser or other cutting tool.

Figure 6A:
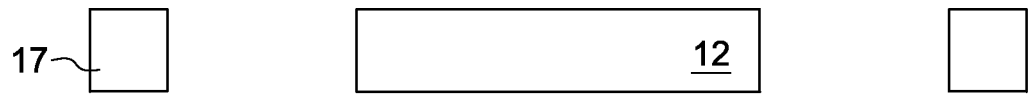
FIG. 6A, FIG. 6B, FIG. 6C, FIG. 6D, FIG. 6E and FIG. 6F illustrate a manufacturing method in accordance with an embodiment of the present disclosure.
Figure 6B:
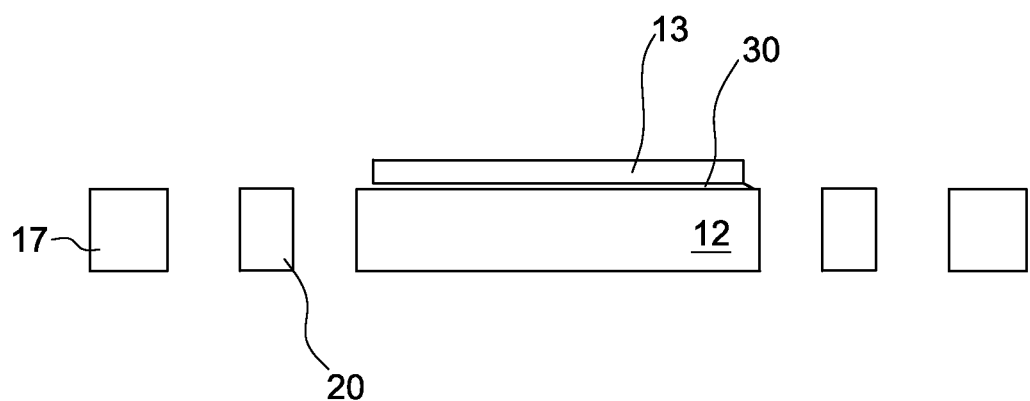
Figure 6C:
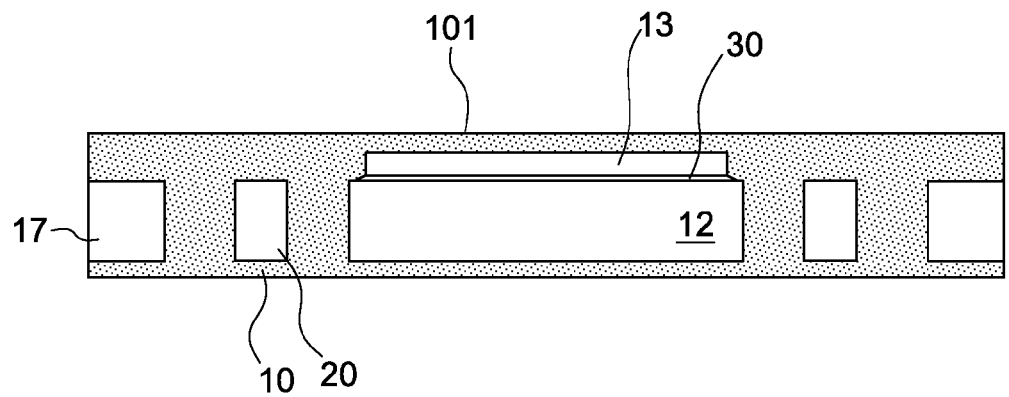

FIGS. 6A, 6B, 6C, 6D, 6E and 6F illustrate a manufacturing method in accordance with an embodiment of the present disclosure similar to the method as illustrated and described with reference to FIG. 5A, FIG. 5B, FIG. 5C, FIG. 5D, FIG. 5E and FIG. 5F, except that a magnetic material 20 is placed in the space between the die pad 12 and the leads 17 as shown in FIG. 6B.

Figure 6D:
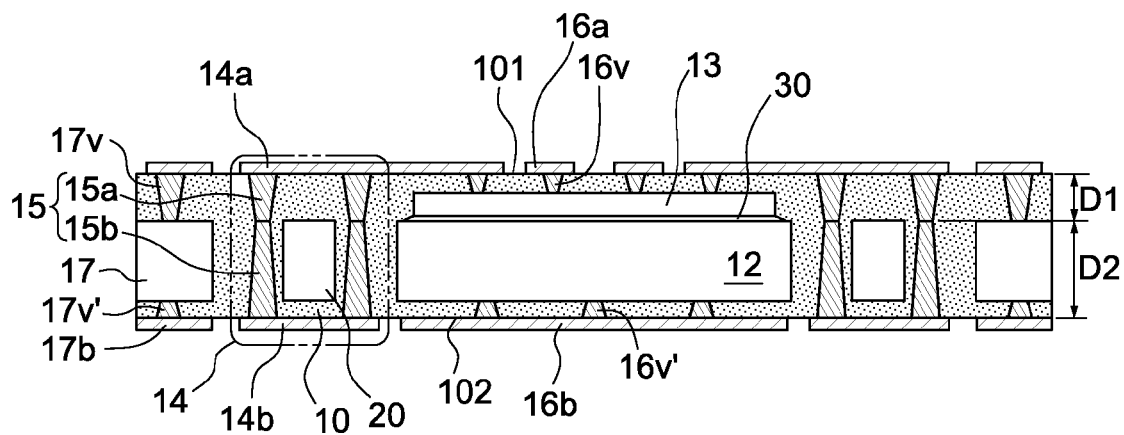
Figure 6E:
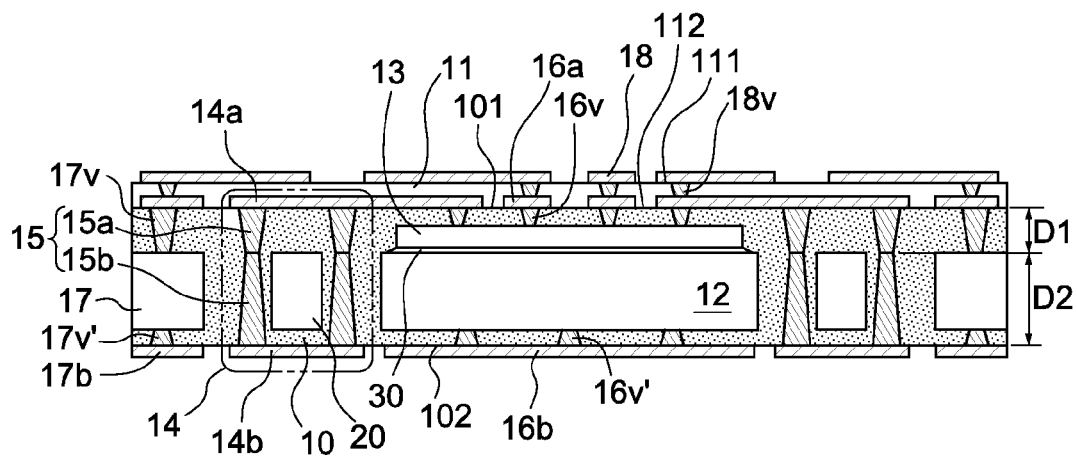
Figure 6F:
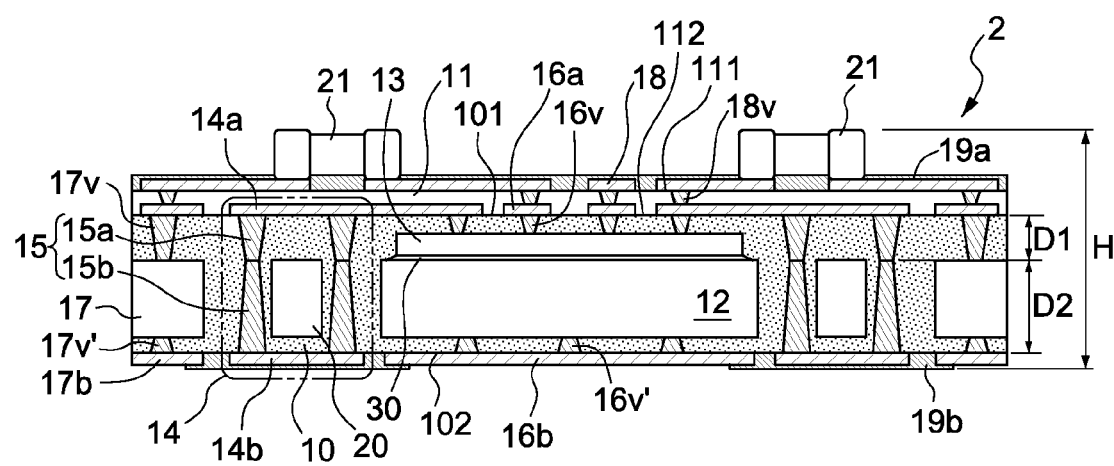

As shown in FIG. 6D, the through vias 15 are arranged such that they are not electrically connected to the magnetic material. Therefore, the magnetic material 20 is buried in the first dielectric layer 10 and located within the central space (the core) of a 3D solenoid structure, such as the spiral inductor 14. The magnetic material 20 may comprise, for example, Co, Fe, CoFeB, NiFe or the like.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation.

In some embodiments, two surfaces can be deemed to be coplanar or substantially coplanar if a displacement between the surfaces is small, such as no greater than 1 µm, no greater than 5 µm, or no greater than 10 µm.

In some embodiments, two components can be deemed to be parallel or substantially parallel if an angle between the directions in which the two components are positioned is small, such as no greater than 10 degrees, no greater than 5 degrees, or no greater than 1 degree.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first dielectric layer having a first surface and a second surface opposite to the first surface;
   a die pad within the first dielectric layer;
   an active component within the first dielectric layer and disposed on the die pad;
   a plurality of first metal bars disposed on the first surface of the first dielectric layer, the plurality of first metal bars being substantially parallel to each other, and at least one of the plurality of first metal bars being electrically connected to the active component;
   a plurality of second metal bars disposed on the second surface of the first dielectric layer, the plurality of second metal bars being substantially parallel to each other; and
   a plurality of through vias penetrating the first dielectric layer and connecting each of the plurality of first metal bars to a corresponding second metal bar.

2. The semiconductor package structure of claim 1, wherein the plurality of first metal bars, the plurality of second metal bars and the plurality of through vias together form an inductor.

3. The semiconductor package structure of claim 1, wherein the plurality of first metal bars are not parallel to the plurality of second metal bars.

4. The semiconductor package structure of claim 1, wherein
   each of the plurality of first metal bars is arranged in a first direction;
   each of the plurality of second metal bars is arranged in a second direction; and
   the first direction is different from the second direction.

5. The semiconductor package structure of claim 1, further comprising a plurality of leads within the first dielectric layer.

6. The semiconductor package structure of claim 5, further comprising:

a first set of metal contacts being disposed on the first surface of the first dielectric layer and electrically connected to the plurality of leads;

a first set of vias within the first dielectric layer and electrically connecting the first set of metal contacts to the active component.

7. The semiconductor package structure of claim 1, wherein each through via has a downward-tapering upper portion and an upward-tapering bottom portion, and wherein a depth of the downward-tapering upper portion is different from a depth of the upward-tapering bottom portion.

8. The semiconductor package structure of claim 1, further comprising a core surrounded by the plurality of through vias, wherein the core comprises a magnetic material.

9. A semiconductor package structure, comprising:

a first dielectric layer having a top surface;

a die within the first dielectric layer; and a first spiral inductor within the first dielectric layer, at least one terminal of the first spiral inductor being electrically connected to the die, wherein a central axis of the first spiral inductor is substantially parallel to the top surface of the first dielectric layer.

10. The semiconductor package structure of claim 9, wherein the first spiral inductor is arranged at a periphery of the die.

11. The semiconductor package structure of claim 9, wherein the first spiral inductor has a first portion and a second portion, the first portion is exposed from the top surface of the first dielectric layer, and the second portion is exposed from the bottom surface of the first dielectric layer.

12. The semiconductor package structure of claim 11, further comprising a second dielectric layer disposed on the top surface of the first dielectric layer and covering the first set of metal contacts and the first portion of the first spiral inductor.

13. The semiconductor package structure of claim 12, further comprising:

a second set of metal contacts disposed on a top surface of the second dielectric layer; and a second set of vias within the second dielectric layer and electrically connecting the second set of metal contacts to one or more of the first set of metal contacts.

14. The semiconductor package structure of claim 9, further comprising a second spiral inductor electrically connected to the die.

15. The semiconductor package structure of claim 9, further comprising:

a metal layer disposed on the bottom surface of the first dielectric layer; and a third set of vias connecting the metal layer to the die pad.

16. The semiconductor package structure of claim 9, further comprising a core surrounded by the first spiral inductor, wherein the core comprises magnetic material.

* * * * *